US008625245B2

(12) United States Patent
Tornare

(10) Patent No.: US 8,625,245 B2
(45) Date of Patent: Jan. 7, 2014

(54) METHOD FOR PROTECTING AN ELECTRONIC SWITCH INCORPORATED IN AN AUTOMOTIVE VEHICLE, FOR CONTROLLING THE POWER SUPPLY OF AN ELECTRIC LOAD

(75) Inventor: Jean-Marc Tornare, Colomiers (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 195 days.

(21) Appl. No.: 13/382,295

(22) PCT Filed: Jul. 2, 2010

(86) PCT No.: PCT/EP2010/003995
§ 371 (c)(1),
(2), (4) Date: Jan. 5, 2012

(87) PCT Pub. No.: WO2011/003548
PCT Pub. Date: Jan. 13, 2011

(65) Prior Publication Data
US 2012/0106014 A1    May 3, 2012

(51) Int. Cl.
*H02H 3/40* (2006.01)
(52) U.S. Cl.
USPC .......................................................... 361/93.2
(58) Field of Classification Search
USPC .......................................................... 361/93.2
See application file for complete search history.

(56) References Cited

U.S. PATENT DOCUMENTS 5,559,410 A    9/1996  Papazian et al.
5,781,385 A    7/1998  Permuy

FOREIGN PATENT DOCUMENTS

| DE | 41 15 295 | 11/1992 |
| EP | 0 604 289 | 6/1994 |
| EP | 0 782 265 | 7/1997 |
| EP | 0 860 946 | 8/1998 |

OTHER PUBLICATIONS

International Search Report dated Aug. 16, 2010, corresponding to PCT/EP2010/003995.

*Primary Examiner* — Jared Fureman
*Assistant Examiner* — Kevin J Comber
(74) *Attorney, Agent, or Firm* — Young & Thompson

(57) ABSTRACT

A method for protecting an electronic switch incorporated in an automotive vehicle in order to control the power supply of an electric load, the method including implementing a protection strategy, based on the use of a table of overload intensity values IS, intended to make it possible to detect and count the overshoots of the overload values IS, and to interrupt the operation of the electronic switch beyond a given number of overloads undergone. A table of overload intensities IS is established giving, for values of the power supply voltage that are greater than a predetermined voltage value VNbat, values $IS=IT+\Delta Ic$, with $\Delta Ic$ being identical for all the values, and for values of the power supply voltage that are less than or equal to VNbat, a constant value IS such that $IS=IT(VNbat)+\Delta Ic$.

2 Claims, 1 Drawing Sheet

Figure 1:
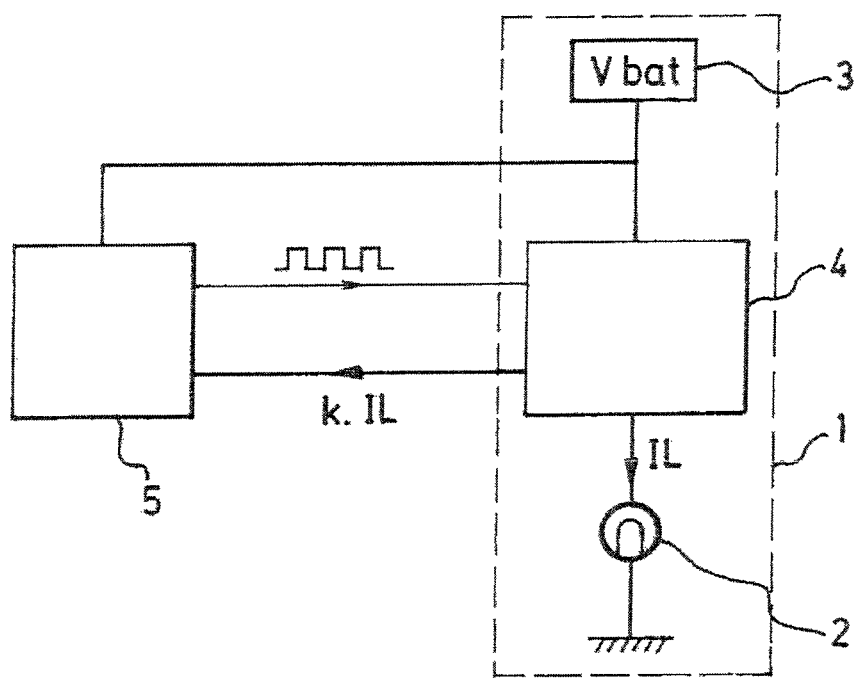

METHOD FOR PROTECTING AN ELECTRONIC SWITCH INCORPORATED IN AN AUTOMOTIVE VEHICLE, FOR CONTROLLING THE POWER SUPPLY OF AN ELECTRIC LOAD

The invention relates to a method for protecting an electronic switch incorporated in an automotive vehicle comprising a power supply battery, in order to control the power supply of an electric load having a startup period before reaching a steady state of operation.

The electric loads incorporated in the automotive vehicles, such as light sources, motors, computers, etc. are routinely powered electrically via an electronic switch adapted to protect them against overloads and short circuits, and, for this purpose, adapted to detect the overloads and order a switching-off of the power supply followed by an automatic resumption thereof after a predetermined time period.

Although such electronic switches provide effective protection for the electric loads powered through them, it has been found, in contrast, that they were a potential source of accidents. This is because each change of state of these electronic switches results in degradation thereof, so that operating failures occur after a given number of state change cycles. Now, such failures may result in a permanent short-circuit of the electric circuit incorporating the electronic switch and the vehicle power supply battery, and cause a fire to start.

Since such a risk is inconceivable in the automobile sector, the current solution lies in a protection method that implements a protection strategy based on the use of a table of so-called overload intensity values IS such that each value of IS=IT+ΔI, with IT being the theoretical intensity of the current flowing through the electronic switch for a given value of the voltage at the terminals of the power supply battery, and ΔI being a predetermined value representative of an electric overload, said protection strategy consisting, in the steady state of the electric load:

in regularly measuring the value of the voltage at the terminals of the power supply battery and a value representative of the current IL flowing through the electronic switch, and in comparing each measured intensity value IL with the value IS corresponding to the same voltage of the table of overload intensities, and in counting the overshoots of the overload values IS so as to interrupt the operation of the electronic switch when the number of overloads undergone reaches a predetermined value, then in informing the owner of the vehicle of the need to have the electronic switch changed.

However, during each startup period of the electric load, the protection strategy is systematically inhibited for a predetermined time period according to the electric characteristics of said electric load. This interruption of the protection strategy during the startup periods is made compulsory in order to avoid untimely outages of the power supply of the electric load, because of the current spike that occurs during these periods, which makes it impossible to distinguish between an accidental overload and an overload corresponding to the current spike.

However, the power supply voltage of the present-day power supply batteries routinely varies between 8 volts and 24 volts and, for low power supply voltage values (of around 8-9 volts), the startup periods last for a significant time, and all the more so when the pulse width modulation (PWM) technique is applied to synthesize the power supply current.

Thus, by way of example, for a power supply voltage of 8 volts, the startup period may have a duration of around 200 milliseconds on an on/off command, and reach a duration of around 1.5 seconds for a PWM command.

Since the duration of the inhibition period is proportional, for a given electric load and power supply mode, to the duration of the longest startup period, it therefore follows that the protection strategy is inhibited for significant time periods likely to render the protection method unreliable.

By way of example, given the length of the inhibition period, the protection method currently implemented may thus prove to have a very relative reliability in the following cases:

control of a "stop light" lamp, the ignition period of which is often of around a few tens of milliseconds and less than a second, control of an indicator light, the ignition time of which is of around 300 milliseconds, repeated poor contact resulting, alternatively, in steady state operation followed by a startup period.

The present invention aims to overcome this drawback, and its main objective is to provide a method for protecting an electronic switch that optimally reduces the inhibition times of the protection strategy implemented.

To this end, the invention targets a method, such as described in the above preamble, for protecting an electronic switch incorporated in an automotive vehicle comprising a power supply battery, in order to control the power supply for an electric load having a startup period before reaching a steady operating state, and this protection method consists, according to the invention, in establishing a table of overload intensity values IS giving:

for values of the voltage at the terminals of the battery that are greater than a predetermined voltage value VNbat, values IS=IT+ΔIc, with ΔIc being identical for all said values, and, for values of the voltage at the terminals of the battery that are less than or equal to VNbat, a constant value IS such that: IS=IT(VNbat)+ΔIc, with IT(VNbat) being the theoretical intensity of the current for the voltage VNbat.

By establishing a specific table of overload intensity values IS, the method according to the invention means, very simply, that the inhibition time of the protection strategy can be reduced to a duration that does not correspond to the lower limit of the band of power supply voltages, but to the voltage VNbat.

In practice, the value of VNbat is selected so as to obtain a good trade-off between a minimum inhibition time and a maximum value of the number (in thousands) of state changes that the electronic switch can undergo, with a safety margin, for this value VNbat.

Advantageously, a good trade-off is thus obtained by selecting a value VNbat equal to the nominal value of the voltage of the power supply battery. Thus, for example, for a 24 volt power supply battery, a value VNbat equal to 14 volts will advantageously be selected.

By way of example, an inhibition time of around 1.5 seconds, required for a PWM command according to the technique currently implemented, can be reduced to a value of around 300 milliseconds according to the method of the invention.

Also by way of example, on an on/off command, the inhibition time required according to the technique currently implemented can be reduced by half according to the method of the invention.

Figure 2:
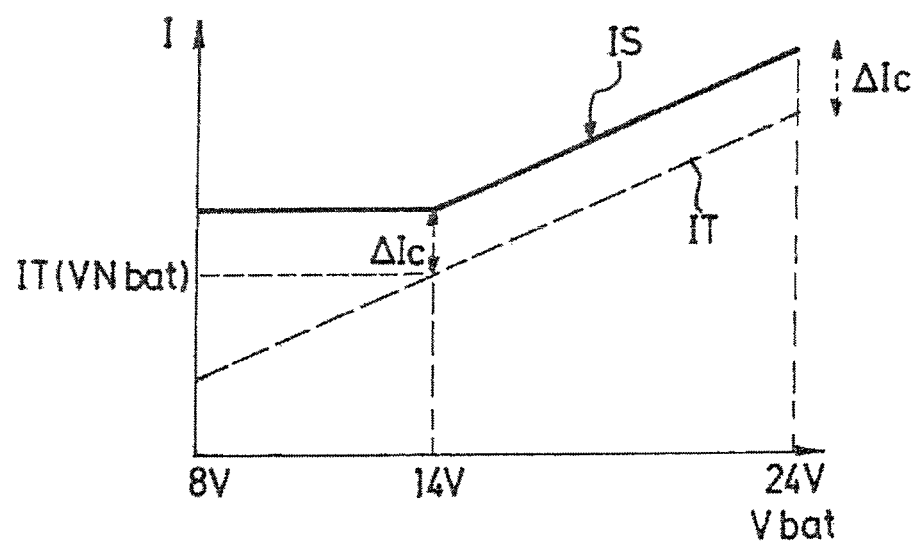

Other features, aims and advantages of the invention will emerge from the following detailed description with reference to the appended drawings which represent a preferred embodiment thereof by way of nonlimiting example. In these drawings:

FIG. 1 is an electrical circuit diagram of a power supply device of an electric load capable of implementing the protection method according to the invention, and FIG. 2 is a diagram representative of a curve according to the invention, representing the variations of the overload intensities as a function of the power supply voltage.

The appended FIG. 1 represents a power supply circuit 1 of an electric load, in this example consisting of an incandescent lamp 2, comprising a power supply battery 3, usually a 14 volt battery, that is to say a battery the power supply voltage Vbat of which is considered to be able to vary between 8 volts and 24 volts. This electric circuit 1 also comprises an electronic switch 4 for controlling the power supply of the electric load 2, usually incorporating means for measuring the intensity of the current IL flowing through said electronic switch, comprising an output to which a current of intensity kIL proportional to IL is delivered.

The management of the operation of this electronic switch 4 is conventionally handled by means of a computer 5 linked to said electronic switch and designed, in the example, to synthesize the power supply current of the electric load 2 by the pulse width modulation (PWM) technique.

This computer 5 is also linked to the output of the measurement means of the electronic switch 4 so as to receive a signal representative of the value kIL.

This computer 5 also comprises means for storing overload intensity IS values exhibiting:
  for values of the voltage at the terminals of the power supply battery 3 that are greater than the value of the nominal voltage of 14 volts, values IS=IT+ΔIc, with IT being the theoretical intensity of the current flowing through the electronic switch 4 for a given value of the voltage at the terminals of the power supply battery 3, and ΔIc being a predetermined constant value representative of an electric overload,
  and, for values of the voltage at the terminals of the power supply battery 3 that are less than or equal to 14 volts, a constant value equal to the value of IS for this power supply voltage of 14 volts.

Furthermore, the value ΔIc is advantageously equal to: 0.6 ITN, with ITN being the nominal intensity of the current.

The curve representative of these values is shown in FIG. 2, which contains the theoretical curve of the intensities IT, and the curve of the overload intensities IS.

To give an illustration with numbers, for an electric load 2 consisting of a 21 watt lamp, the intensity of the nominal current ITN, corresponding to the voltage of 14 volts, is equal to 2 A, the intensity IT(24 V) is equal to 3.4 A, and the intensity IT(8 V) is equal to 0.85 A. The value of ΔIc determining the overload intensity values is 1.2 A.

Using the overload intensity values IS as a base, the computer 5 is programmed to implement, in the steady state of the electric load 2, a protection strategy consisting:
  in periodically measuring the value of the voltage at the terminals of the power supply battery 3, and in recording the corresponding value of the intensity kIL,
  in comparing the intensity value IL deduced from the recorded value kIL with the corresponding overload intensity value IS,
  and, when the value of IL is greater than IS:
    on the one hand, in incrementing a counter counting the overloads undergone by the electronic switch 4,
    and, on the other hand, in controlling a switching of the electronic switch 4 to its passive state, then a reverse switching to restore conduction, after a predetermined outage time period.

Furthermore, when the counter counting the overloads reaches a predetermined value, of an order of magnitude corresponding to thousands of overloads detected, the computer 5 orders a final switching of the electronic switch 4 to its passive state, followed by an announcement alerting the driver that the switch has been taken out of service, for example in the form of a message prompting the driver to take the vehicle to a garage.

On each startup period of the electric load 2, the computer 5 is, however, programmed to inhibit the protection strategy described above, and therefore to keep the electronic switch 4 in its active conducting state, for a predetermined time period after the start of this startup period.

This predetermined time period depends on the electric characteristics of the electric load 2, and corresponds to the time needed for the intensity of the current IL to become less than the overload intensity IS. In practice therefore, and for the curve of values shown in FIG. 2, the inhibition time is equal to the inhibition time required for the nominal voltage of 14 volts, of around a few hundred milliseconds for an electric load 2 consisting of a conventional light source.

Because of this, this inhibition time is significantly reduced compared to the inhibition time of around 1.5 seconds required, under similar operating conditions, by the implementation of the present-day protection methods.

The invention claimed is:

1. A method for protecting an electronic switch (4) incorporated in an automotive vehicle comprising a power supply battery (3), in order to control the power supply of an electric load (2) having a startup period before reaching a steady operating state, said protection method consisting:
  in the steady state of the electric load (2), in implementing a protection strategy based on the use of a table of so-called overload intensity values IS such that each value of IS=IT+ΔI, with IT being the theoretical intensity of the current flowing through the electronic switch (4) for a given value of the voltage at the terminals of the power supply battery (3), and ΔI being a predetermined value representative of an electric overload, said protection strategy consisting:
    in regularly measuring the value of the voltage at the terminals of the power supply battery (3) and a value representative of the current IL flowing through the electronic switch (4), and in comparing each measured intensity value IL with the value IS corresponding to the same voltage of the table of overload intensities,
    and in counting the overshoots of the overload values IS so as to interrupt the operation of the electronic switch (4) when the number of overloads undergone reaches a predetermined value,
    and, during each startup period of the electric load (2), in inhibiting the protection strategy for a predetermined time period according to the electric characteristics of said electric load,
  said protection method being characterized in that a table of overload intensity values IS is established showing:
    for values of the voltage at the terminals of the power supply battery (3) that are greater than a predetermined voltage value VNbat, values IS=IT+ΔIc, with ΔIc being identical for all said values,
    and, for values of the voltage at the terminals of the power supply battery (3) that are less than or equal to VNbat, a constant value IS such that IS=IT(VNbat)+ΔIc, with IT(VNbat) being the theoretical intensity of the current for the voltage VNbat.

2. The protection method as claimed in claim 1, characterized in that value VNbat is selected that is equal to the nominal voltage value of the power supply battery (3).

* * * * *